July 18, 1967 T. L. DENNIS, JR 3,332,017
COMBINED ALC AND POWER LEVEL TRANSMITTER CONTROL
Filed April 2, 1965
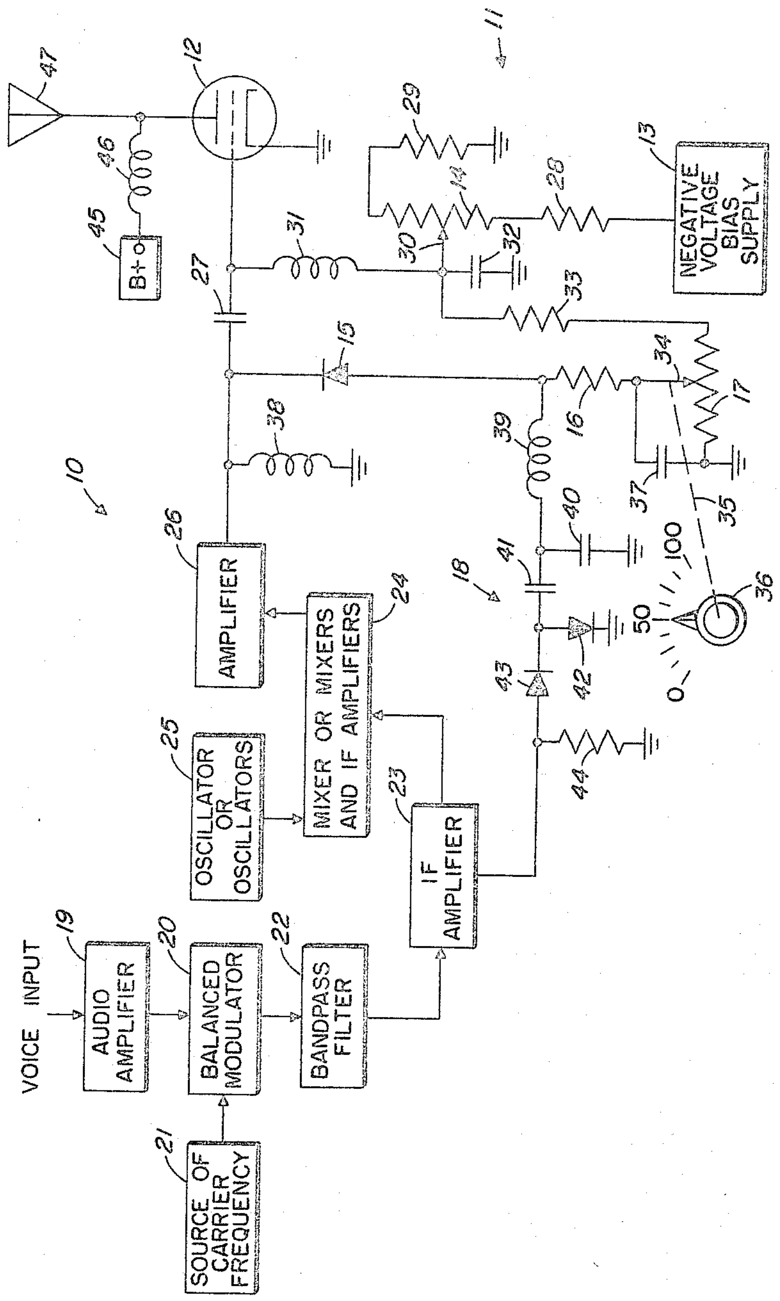
INVENTOR.
TOM L. DENNIS JR.
BY Moody and Kintzinger
ATTORNEYS 3,332,017
Patented July 18, 1967

3,332,017
COMBINED ALC AND POWER LEVEL TRANSMITTER CONTROL

Tom L. Dennis, Jr., Cedar Rapids, Iowa, assignor to Collins Radio Company, Cedar Rapids, Iowa, a corporation of Iowa Filed Apr. 2, 1965, Ser. No. 445,074
10 Claims. (Cl. 325—187)

ABSTRACT OF THE DISCLOSURE

A combined automatic load control with a continuously variable power level control with ALC developed in a transmitter without output distortion at any power output level adjustably selected. This includes a power level control potentiometer bridged between the arm of a final amplifier stage bias adjustment potentiometer and ground. The conduction point of a diode connected in series with a resistor between the power adjustment level arm of the power level control potentiometer is set and thereby the RF signal output line feeding the final amplifier stage. The ALC voltage developed across the resistor in series with the diode is applied through an ALC network to preceding RF circuitry in the transmitter.

This invention relates in general to transmitter gain control and power level control, and in particular to a combined automatic load control with a continuously variable power level control with ALC developed without output distortion at any power output level desired by the operator.

Various ALC circuits have been employed for preventing the overdriving of the final amplifier or amplifiers of single sideband transmitters. This use of ALC is primarily to prevent distortion products from being generated and also to help raise the ratio of average power to peak power. Many of these ALC circuits function either by sensing grid current in the final amplifier, or by sensing current in a diode set up to function as a false grid. With many such systems the ALC voltage has usually been developed only at maximum output and therefore, to limit the peak power output of a transmitter, it would be necessary to change the D.C. operating voltages on the final amplifier. Another way of reducing output is by reducing audio input power levels, however, this is undesirable, in many cases, since any advantage of increased average power to peak power is lost and furthermore, this leaves nothing to positively limit power output at a predetermined level. Some existing circuits allowing ALC to be developed at less than full power output utilize a diode acting as a false grid with a level control used for setting the conduction point of the diode. A serious drawback with this type of circuit, however, is that the bias operating point of the final amplifier must change in order to develop ALC voltage. Such operating point change has been found to cause unwanted distortion in the output signal.

It is, therefore, a principal object of this invention to provide ALC combined with a continuously variable power level control.

Another object is to provide development of ALC without signal distortion at any power output level chosen by the operator between 0 and 100% of full power as related to any chosen bias voltage for the final amplifier stage up to the rated bias voltage level of the output amplifier stage.

Still another object is to provide a single bias supply equipped combination ALC and power level control circuit with the bias voltage for the final amplifier stage adjustable from a lower limit up to an upper rated bias limit for the final amplifier stage.

Features of this invention useful in accomplishing the above objects include a power level control potentiometer bridged between the arm of a final amplifier stage bias adjustment potentiometer and ground. It is a power level control that may be set to any variable between zero and substantially the negative bias of the final amplifier tube for control by setting the conduction point of a diode connected in series with a resistor between the power adjustment level arm of the power level control potentiometer and the RF signal output line feeding the final amplifier stage. The circuitry includes a bias voltage level setting control connected to a minus bias voltage supply and having a D.C. connection through an RF choke to the grid of the final amplifier stage. The arm of the power level control potentiometer is connected through, serially, a resistor and diode to a first portion of the RF signal output line separated by a capacitor from a second portion of the RF signal output line directly connected to the final amplifier stage grid. An RF choke coil is connected between the first portion of RF signal output line and ground to hold this portion of the line nominally to D.C. ground. The ALC voltage developed across the resistor in series with the diode is applied through an ALC network to preceding RF circuitry in the transmitter.

A specific embodiment representing what is presently regarded as the best mode of carrying out the invention is illustrated in the accompanying drawing.

Referring to the drawing:

The transmitter, generally indicated by the number 10, is equipped with a combined ALC and power level control system 11. Transmitter 10, which is fed audio signals to be transmitted, is equipped with an output power amplifier 12. A negative voltage bias supply 13 provides the operating voltage bias, at a level as determined by adjustment potentiometer 14, for the grid of power amplifier 12. Diode 15 and resistor 16 serially connected between a first portion of RF output line and the arm of power level control potentiometer 17, are components of a system giving ALC that is developed with any power level control setting between 0 and 100% of full power for any prechosen final amplifier tube 12 bias setting. Further, it is a system providing operation with no shift in the operating point of the final amplifier tube 12 at the ALC threshold. The ALC signals developed across resistor 16 are applied through negative voltage doubler and rectifier circuit 18 and the ALC line to amplifier gain control circuitry in transmitter 10.

More specifically, an originating audio signal to be transmitted, which may be a voice input, is amplified by audio amplifier 19. The audio signal is then heterodyned in balanced modulator 20 (any conventional modulator could be used) with a carrier frequency from a source 21. The output, as a transmitter drive voltage, from modulator 20, is fed through bandpass filter 22 to IF amplifier 23. IF amplifier 23 is subject to gain control by negative automatic load control voltages that may be applied through the ALC line from the negative voltage doubler and rectifier circuit 18.

The output from the IF amplifier may be applied to a mixer or mixers, and additional IF amplifiers, indicated generally by block 24. The mixer or mixers of block 24 are fed an additional frequency input or inputs, as the case may be, from oscillator or oscillators, indicated generally by block 25. The ultimate output from block 24 is fed to amplifier 26 from which the output is coupled through, serially, the first portion of the RF output line, capacitor 27, and a second portion of the RF output line to the grid of power amplifier 12. The power amplifier 12 may be a conventional type operable as a class $A_1$ or $AB_1$ amplifier. Bias, for example, minus 60 volts, or anything from 0 down to minus 60 volts, or more, as appropriate, for the grid of power amplifier 12 is supplied by the negative voltage supply 13 at the voltage bias level setting of the bias level adjusting potentiometer 14.

Negative voltage bias supply 13 is connected, serially, through resistor 28, adjustable potentiometer 14, and resistor 29 to ground. The voltage bias level adjustment arm 30, of potentiometer 14, is connected through RF choke 31 to the grid of power amplifier tube 12, and also through an RF signal passing capacitor 32 to ground. Potentiometer adjustment arm 30 is also connected through, serially, resistor 33 and power level control potentiometer 17 to ground. The potentiometer 17 adjustment arm 34, which is connected by drive train 35 to power setting control knob 36, is connected electrically through RF passing capacitor 37 to ground and also through, serially, resistor 16 and diode 15 to the first portion of the RF output line. It should be noted that the power level control potentiometer 17 and the control knob 36 therefore may be located at a remote position as a matter of convenience. The first portion of the RF output line is also connected through RF choke coil 38 to ground in order that that portion of the line and the cathode of diode 15 connected thereto may be nominally held to D.C. ground. The common junction between resistor 16 and the anode of diode 15 is connected through RF choke 39 to a common junction between an RF signal passing capacitor 40 to ground and a coupling capacitor 41 to the common junction of the diodes 42 and 43 of the negative voltage doubler and rectifier circuit 18. The anode of diode 42 is connected to the junction of diode 43 and capacitor 41, and the cathode is connected to ground. The cathode of diode 43 is connected to capacitor 41 and the anode is connected through the ALC line to IF amplifier 23 and also through resistor 44 to ground.

The plate of power amplifier tube 12 is positively biased, for example, B+ voltage from voltage supply 45 through a coil 46 used as a choke for blocking RF. The output from power amplifier tube 12 is fed through a transmission line to transmitting antenna 47 in a conventional manner. It should be noted that, the resistor 33 is a relatively small resistor as compared to the resistance of potentiometer 34 to prevent tube 12 from drawing heavy grid current when the adjustment arm of the potentiometer 34 is in the 100% power level setting. Further, the value of resistor 33 should be such a resistance value as to give a voltage drop substantially that required to fire diode 15, or less, if it is to be possible to attain the full range of power settings to the 100% power level setting of potentiometer 34 consistent with any prechosen voltage bias setting of potentiometer 14.

To further understand operation of applicant's variable power level control and ALC system assume that potentiometer 17 is set to the 100% power position to the right by clockwise manual setting of control knob 36 to the 100% power position. With this setting, diode 15 is provided with a reverse bias substantially equal to the grid bias voltage set on potentiometer 14 except for the voltage drop across resistor 33 which is substantially balanced by the firing potential voltage drop of the diode 15. With such a reverse bias the diode 15 is driven to conduction at substantially the same RF signal voltage level through the RF signal output line portions as that RF signal level having such excursion peaks as to drive the grid of final power amplifier stage 12 into conduction. As diode 15 conducts the resulting D.C. current flow through resistor 16 develops a voltage drop across the resistor 16 with the resulting negative going voltage at the junction of resistor 16 and diode 15 being taken off through RF choke coil 39 to become an ALC voltage used in reducing gain of one or more previous RF and IF stage or stages. The chosen value of resistor 16 is a determining factor in the resulting ALC sensitivity of the circuit, voltage drops across which determine the ALC voltage without having any significant effect in altering the grid bias of final amplifier tube 12. Thus, no distortion is generated in the final amplifier stage at any time ALC voltage is being developed.

When the power level control potentiometer 17 is set to the other extreme to substantially 0 power level there is substantially no bias voltage impressed on diode 15 which, as a result, is driven to conduction by substantially any relatively low power RF input level even those having signal excursions as low as a few millivolts. This results in ALC voltage being developed across resistor 16 with such extremely low RF signal levels that the transmitter power output developed through tube 12 is held to virtually a 0 power level. Thus, it becomes readily apparent that the power output of the transmitter is substantially completely controllable by the position of the adjustable arm 34 of power level control potentiometer 17 as determined by control knob 36 and that this power level control may be set for any power level in the range from substantially 0 to substantially 100% of full power as related to any particular prechosen bias setting of the control arm 30 of bias level potentiometer 14 up to the top rated bias setting for final amplifier tube 12. Again, it should be pointed out that this is all accomplished with no shift in the preset operating point of the tube 12 at any ALC developing action set threshold.

Components and values used with installation of a combined ALC and continuously variable power level control circuit system in an amateur transceiver include the following:

| | | |
|---|---|---|
| Negative voltage supply 13 | volts | −150 |
| Adjustable potentiometer 14 | ohms | 1K |
| Diode 15 | | 1N914 |
| Resistor 16 | ohms | 820 |
| Adjustable potentiometer 17 | do | 2.5K |
| Capacitor 27 | μμf | 3300 |
| Resistor 28 | ohms | 2K |
| Resistor 29 | do | 1K |
| Choke coils 31, 38, and 39 | mh | 220 |
| Capacitor 32 | μf | 0.01 |
| Resistor 33 | ohms | 82 |

Other components of the ALC circuitry and other associated circuitry in the transceiver used for the test are standard components such as normally used in comparable circuit sections of other transceiver or transmitter equipments.

Whereas this invention is here illustrated and described with respect to a specific embodiment thereof, it should be realized that various changes may be made without departing from the essential contribution to the art made by the teachings hereof.

I claim:

1. A radio transmitting system having a power amplifier, and automatic load control circuitry, for controlling the gain of the transmitting system, combined with variable power level control circuitry; said combined circuitry including: a control element in said power amplifier; a minus voltage bias source; a voltage bias adjustment potentiometer having opposite ends and a movable tap, with the ends connected to the minus voltage bias source and a relatively higher voltage level reference, respectively, and with said movable tap connected to the control element in said power amplifier; the movable tap of said voltage bias adjustment potentiometer also being connected to an end of a power level control potentiometer, and through the power level control potentiometer to a voltage potential reference; said power level control potentiometer having a movable tap connected to a first portion of an RF signal line separated by an RF signal coupling capacitor from a second portion of the RF signal line connected to said control element of said power amplifier; the connection of the power level control potentiometer tap to said first RF line portion being a connection through a serially connected resistor and diode; and ALC circuitry connected to the common junction of said resistor and said diode.

2. The radio transmitting system of claim 1, wherein an RF choke coil is included in the connection of the movable tap of the voltage bias adjustment potentiometer and said control element in said power amplifier.

3. The radio transmitting system of claim 1, wherein said serially connected resistor and diode are connected in the circuit with the resistor between the diode and the power level control potentiometer tap.

4. The radio transmitting system of claim 1, wherein said diode is connected in the circuit with the cathode connected to said first portion of the RF signal line.

5. The radio transmitting system of claim 1, wherein an RF choke coil is connected between said first portion of an RF signal line and a voltage potential reference.

6. The radio transmitting system of claim 1, including a power setting control knob drive connected to the tap of said power level control potentiometer.

7. In an automatic load control system for a radio transmitter having a power amplifying device with a control element, audio input and amplifying means, signal modulating means, IF amplifying means, an antenna, means for feeding the modulated and amplified signal of the transmitter to said control element of the power amplifying output device, means for applying the output of said power amplifying output device to said antenna, and amplifying gain control means; an RF line having a first portion separated from a second portion by an RF signal coupling capacitor, and with the RF line second portion directly connected to the said control element of the power amplifying output device; a minus voltage bias source connected to said control element of the power amplifying output device; said minus voltage bias source also being connected to a voltage divider having an adjustable voltage level output connection; with the voltage divider adjustable voltage level output connection being connected to said first portion of the RF signal output line through a series connected impedance means and unidirectional current flow device; and with automatic load control circuitry connected to the junction of the impedance means and said unidirectional current flow device.

8. The automatic load control system for a radio transmitter of claim 7, wherein the minus voltage bias source connection to said control element includes, serially, impedance means and an RF choke coil; and with the connection of the minus voltage bias source with said voltage divider including a connection from the common junction of the impedance means and said RF choke coil interconnecting said minus voltage bias source and said control element.

9. The automatic load control system for a radio transmitter of claim 8, wherein the series connected impedance means and unidirectional current flow device interconnecting the adjustable voltage level output connection of said voltage divider and said first portion of the RF output signal line are, a resistor and a diode, respectively.

10. The automatic load control system for a radio transmitter of claim 7, including resistive means between a limit position of the adjustable voltage level output connection of said voltage divider and said minus voltage bias source; said unidirectional current flow device having a determinate voltage drop to conduction firing factor; and with said resistive means being of such a resistive value as to develop a voltage drop in a range up to substantially the voltage drop to conduction firing factor of said unidirectional current flow device.

References Cited

UNITED STATES PATENTS

| | | | |
|---|---|---|---|
| 3,106,680 | 10/1963 | De Long et al. | 325—187 |
| 3,139,582 | 6/1964 | Spierling | 325—144 X |
| 3,258,711 | 6/1966 | Searl et al. | 330—137 |

JOHN W. CALDWELL, *Acting Primary Examiner.*

B. V. SAFOUREK, *Assistant Examiner.*